(12) United States Patent
Sasaki et al.

(10) Patent No.: US 8,833,772 B2
(45) Date of Patent: Sep. 16, 2014

(54) SEAL STRUCTURE FOR ELECTRONIC EQUIPMENT

(75) Inventors: Takashi Sasaki, Fujisawa (JP); Tomoko Nakano, Fujisawa (JP); Naohiro Fujisawa, Fujisawa (JP); Keiichi Miyajima, Fujisawa (JP)

(73) Assignee: Nippon Mektron, Ltd. (JP)

( * ) Notice: Subject to any disclaimer, the term of this patent is extended or adjusted under 35 U.S.C. 154(b) by 215 days.

(21) Appl. No.: 13/059,595

(22) PCT Filed: Aug. 6, 2009

(86) PCT No.: PCT/JP2009/063912
§ 371 (c)(1),
(2), (4) Date: Feb. 17, 2011

(87) PCT Pub. No.: WO2010/024097
PCT Pub. Date: Mar. 4, 2010

(65) Prior Publication Data
US 2011/0140375 A1    Jun. 16, 2011

(30) Foreign Application Priority Data

Aug. 27, 2008  (JP) ................................ 2008-217678
Mar. 24, 2009  (JP) ................................ 2009-071689

(51) Int. Cl.
*F16J 15/02*   (2006.01)
*H05K 5/06*    (2006.01)
*F16J 15/10*   (2006.01)

(52) U.S. Cl.
CPC ............... *F16J 15/104* (2013.01); *H05K 5/061* (2013.01)

USPC ........................... 277/639; 277/637; 277/630

(58) Field of Classification Search
USPC .......... 277/628, 630, 637, 639, 650, 652, 654
See application file for complete search history.

(56) References Cited

U.S. PATENT DOCUMENTS

| | | | | |
|---|---|---|---|---|
| 3,026,367 | A | * | 3/1962 | Hartwell ....................... 174/357 |
| 5,564,714 | A | | 10/1996 | Katsuno et al. |
| 5,794,947 | A | * | 8/1998 | Shimizu ........................ 277/630 |
| 7,029,013 | B2 | * | 4/2006 | Yajima et al. ................. 277/637 |
| 7,446,264 | B2 | * | 11/2008 | Kouda et al. .................. 174/356 |

FOREIGN PATENT DOCUMENTS

| | | |
|---|---|---|
| JP | 6-201048 A | 7/1994 |
| JP | 6-307549 A | 11/1994 |
| JP | 8-145181 A | 6/1996 |
| JP | 11-054950 A | 2/1999 |
| JP | 2005-195138 A | 7/2005 |

* cited by examiner

*Primary Examiner* — Gilbert Lee
(74) *Attorney, Agent, or Firm* — Harness, Dickey & Pierce, P.L.C.

(57) ABSTRACT

In order to enhance a shape retaining property of a gasket consisting only of a rubber, prevent damage to a casing for an electronic equipment due to high reactive force of the gasket, and make assembling of the casing easy, a seal structure comprises a gasket installed in a non-adhesion manner between a case and a lid to be interposed in a compressed state when the case and the lid are assembled, and a resin film integrated with the gasket to enhance the shape retaining property of the gasket, the gasket has a portion compressed between the case and the lid when they are assembled, and a portion not compressed between them when assembled and the resin film is integrated with the portion which is not compressed.

25 Claims, 7 Drawing Sheets

SEAL STRUCTURE FOR ELECTRONIC EQUIPMENT

CROSS-REFERENCE TO RELATED APPLICATIONS

This is a national stage of International Application No. PCT/JP2009/063912 filed on Aug. 6, 2009 and published in the Japanese language. This application claims the benefit of Japanese Application No. 2008-217678, filed Aug. 27, 2008 and Japanese Application No. 2009-071689, filed on Mar. 24, 2009. The disclosures of the above applications are incorporated herein by reference.

BACKGROUND OF THE INVENTION

1. Field of the Invention

The present invention relates to a seal structure for an electronic equipment, and more particularly to a seal structure to prevent a water droplet from entering into an inner portion of the electronic equipment such as a cellular phone user terminal or the like. Accordingly, the seal structure in accordance with the present invention is preferably utilized as a seal structure for a waterproofed electronic equipment.

2. Description of the Conventional Art

For example, in the cellular phone user terminal, a casing is formed by a combination of a case and a lid which are fitted to each other, and a gasket 31 constructed by an O-ring or the like made of rubber only is interposed between a case 11 and a lid 21 as partly shown in FIG. 11 to prevent a water droplet from entering into an inner portion of the casing (refer to Japanese Unexamined Patent Publication No. 11-54950). Further, since downsizing and thinning of the casing are now demanded, the gasket 31 is required to have a small cross sectional shape and a low hardness in order to make a burden to the casing as small as possible.

However, if the gasket 31 is made to have a small cross sectional shape and a low hardness as mentioned above, a rigidity of the gasket 31 itself is lowered, and a handling performance (a handling and working property) is lowered. Accordingly, an operating efficiency of a user terminal assembling step is deteriorated in addition to an assembling work of the gasket 31.

In order to solve the problem, as shown in FIG. 12, there can be a thought of integrating a resin film 41 with the gasket 31 over a whole periphery in order to enhance a shape retaining property of the rubber only gasket 31. Since the rigidity of the resin film 41 is higher than that of the gasket 31, the gasket 31 is hardly deformed by the integration of the resin film 41, and the shape retaining property of the gasket 31 is enhanced.

However, if the resin film 41 is embedded in a thickness of the gasket 31 as illustrated, at a time of integration of the resin film 41 with the gasket 31 as mentioned above, reaction force of the gasket 31 becomes higher since a rate of the thickness of the resin film 41 to the height dimension of the gasket 31 is comparatively large. Accordingly, much load is applied to the casing due to the reaction force, and there is fear that the casing may be broken.

SUMMARY OF THE INVENTION

Problem to be Solved by the Invention

The present invention is made by taking the points mentioned above into consideration, and an object of the present invention is to provide such a seal structure for an electronic equipment that a resin film is integrated with a gasket for enhancing a shape retaining property of a rubber only gasket, reaction force of the gasket does not become higher even by the integration of the resin film and the gasket, a casing of the electronic equipment is thus not broken by high reaction force of the gasket, and the casing can be easily assembled. Further, an additional object of the present invention is to provide a seal structure for an electronic equipment in which the same effect can be achieved by using a resin molded component in place of the resin film.

Means for Solving the Problem

In order to achieve the object mentioned above, in accordance with a first aspect of the present invention, there is provided a seal structure for sealing between a case and a lid which are combined with each other so as to form a casing of an electronic equipment, the seal structure comprising:

a gasket installed in a non-adhesion manner between the case and the lid, and interposed in a compressed state when the case and the lid are assembled; and a resin film integrated with the gasket in order to enhance a shape retaining property of the gasket, wherein the gasket has a non-compressed portion, in addition to a portion which is compressed between the case and the lid when the case and the lid are assembled, and the resin film is integrated with the non-compressed portion.

Further, in accordance with the second aspect of the present invention, there is provided the seal structure in accordance with the first aspect, wherein the gasket and the resin film are integrated by a chemical means, that is, are integrated by adhesion with an adhesive agent which is previously applied to the resin film, or on the basis of self-adhesiveness of a self-adhesive rubber which is used as a material of the gasket.

Further, in accordance with the third aspect of the present invention, there is provided the seal structure in accordance with the first aspect, wherein the gasket and the resin film are integrated by a mechanical means, that is, are integrated by integral molding via through holes provided at a predetermined pitch in the resin film, or integral molding via come-off preventing anchor shaped parts provided at an end portion of the resin film.

Further, in accordance with the fourth aspect of the present invention, there is provided the seal structure in accordance with the first, second or third aspect, wherein an installation position between the case and the lid at which the gasket is installed in the non-adhesion manner is formed in a 3-D shape which has a predetermined planar shape and whose height position changes in an overlapping direction of the case and the lid, and the gasket and the resin film are manufactured in the same 3-D shape as that of the installation position.

Further, in accordance with the fifth aspect of the present invention, there is provided the seal structure in accordance with the first, second, third or fourth aspect, wherein the installation position between the case and the lid at which the gasket is installed in the non-adhesion manner is formed in a groove shape having side wall portions at both sides in a width direction, a height of one side wall portion is set lower than that of the other side wall portion, the resin film is integrated with the gasket at a predetermined height position from a bottom surface portion of the gasket, and the resin film has such a structure that a part thereof is mounted on the one side wall portion when the gasket is installed to the groove.

Further, in accordance with the sixth aspect of the present invention, there is provided a seal structure for sealing between a case and a lid which are combined with each other so as to form a casing of an electronic equipment, the seal structure comprising:

a gasket installed in a non-adhesion manner between the case and the lid, and interposed in a compressed state when the case and the lid are assembled; and a resin molded component integrated with the gasket in order to enhance a shape retaining property of the gasket, wherein the gasket has a non-compressed portion, in addition to a portion which is compressed between the case and the lid when the case and the lid are assembled and the resin molded component is integrated with the non-compressed portion.

Further, in accordance with the seventh aspect of the present invention, there is provided the seal structure in accordance with the sixth aspect, wherein the gasket and the resin molded component are integrated by insert molding in which the gasket is molded by a metal mold in a state that the resin molded component previously manufactured in a product shape is inserted into a cavity space of the gasket forming metal mold.

Further, in accordance with the eighth aspect of the present invention, there is provided the seal structure in accordance with the sixth or seventh aspect, wherein an installation position between the case and the lid at which the gasket is installed in the non-adhesion manner is formed in a 3-D shape which has a predetermined planar shape and whose height position changes in an overlapping direction of the case and the lid, and the gasket and the resin molded component are manufactured in the same 3-D shape as that of the installation position Further, in accordance with the ninth aspect of the present invention, there is provided the seal structure in accordance with the sixth, seventh or eighth aspect, wherein the installation position between the case and the lid at which the gasket is installed in the non-adhesion manner is formed in such a step shape that one side wall portion is omitted from a groove shape having side wall portions at both sides in a width direction, and the resin molded component is arranged at a position corresponding to that of the omitted one side wall portion when the integrated component of the gasket and the resin molded component is installed at the installation position.

If the gasket has the non-compressed portion, in addition to the portion which is compressed between the case and the lid when the case and the lid are assembled, and the resin film is integrated with the non-compressed portion, like as the seal structure in accordance with the present invention having the structure mentioned above, there is constructed the seal structure in which the existence of the resin film does not affect the magnitude of the gasket reaction force at all. Accordingly, it is possible to provide the seal structure in which the gasket reaction force is not enhanced in spite that the shape retaining property of the gasket is enhanced by the integration of the resin film (the first aspect).

In this case, with regard to the integration of the gasket and the resin film, there can be thought of the integration by the chemical means, and the integration by the mechanical means. The integration structure by the former chemical means is specifically structured such that the gasket and the resin film are adhered by the adhesive agent which is previously applied to the resin film, or the gasket and the resin film are adhered on the basis of the self-adhesiveness of the self-adhesive rubber used as the material of the gasket to. In any event, it is possible to firmly couple the gasket and the resin film (the second aspect). Further, the integration structure by the latter mechanical means is structured specifically such that the gasket and the resin film are integrally molded via the through holes provided at a predetermined pitch in the resin film, or the gasket and the resin film are integrally molded via the come-off preventing anchor shaped parts at the end portion of the resin film. After all, it is possible to firmly couple the gasket and the resin film in any event (the third aspect).

Further, in some kind or shape of the electronic equipment, there is a case that the installation position to which the gasket is installed in the non-adhesion manner is formed in a 3-D shape (three dimensional shape) which has a predetermined planar shape and whose height position changes in the overlapping direction of the case and the lid. If the flat gasket having a planar shape is installed at the 3-D shaped installation position, the gasket is deformed by force after the installation, so that there is fear of a seal breakage, a gasket breakage, or the like due to an installation defect. Accordingly, in order to take a countermeasure thereto, it is preferable to manufacture the gasket and the resin film in the same 3-D shape in the case that the installation position is formed in the 3-D shape. In accordance with this structure, since the gasket is not deformed by force after the installation, the installation defect is hardly caused (seating of the gasket with respect to the installation position becomes better) (the fourth aspect).

Further, in the case that the installation position at which the gasket is installed in the non-adhesion manner is formed in the groove shape having the side wall portions at both sides in the width direction, the height of the one side wall portion is set lower than that of the other side wall portion, the film is integrated with the gasket at the predetermined height position from the bottom surface portion of the gasket, and the film has such the structure that a part thereof is mounted on the one side wall portion when the gasket is installed to the groove, seating of the gasket (including the film) with respect to the installation position becomes better similarly to the above, and the installation defect is hardly caused (the fifth aspect).

There can be a thought that the resin molded component is used in place of the resin film integrated with the gasket, for enhancing the shape retaining property of the gasket, and the resin molded component is integrated with the gasket (the sixth aspect). The resin molded component is a three-dimensionally shaped part having a predetermined height dimension in place of the film shaped plane shaped part, and shape retaining force with respect to the gasket is larger than the resin film on the basis of its shape or volume. In order to integrate the resin molded component with the gasket, it is preferable to execute insert molding. In other words, the gasket is integrated by the insert molding in which the gasket is molded in the metal mold in the state that the resin molded component previously manufactured in the product shape is inserted into the cavity space of the gasket forming metal mold (the seventh aspect).

In the case that the installation position between the case and the lid to which the gasket is installed in the non-adhesion manner is formed in a 3-D shape which has a predetermined planar shape and whose height position changes in the overlapping direction of the case and the lid, it is preferable to manufacture the gasket and the resin molded component in the same 3-D shape. In accordance with this structure, since the gasket is not deformed by force after the installation, the installation defect is hardly caused (seating of the gasket with respect to the installation position becomes better) (the eighth aspect).

Further, since the resin molded component is thicker than the resin film so as to have a sufficient rigidity, it is possible to easily carry out an installation work in such a manner as to fit it to the casing. In other words, it is general to provide the groove at the installation position of the casing and insert the integrated component into the groove, in the case of the integrated component of the gasket and the resin film. However, in the case of the integrated component of the gasket and the resin molded component, it is not necessary to provide the groove at the installation position of the casing, but the step may be provided and the integrated component may be fitted to the inner side of the step. The ninth aspect defines this. In particular, the installation position between the case and the lid at which the gasket is installed in the non-adhesion manner is formed in such the step shape that one side wall portion is omitted from the groove shape having the side wall portions at both sides in the width direction, and the resin molded component is arranged at the position corresponding to that of the omitted one side wall portion when the integrated component of the gasket and the resin molded component is installed at the installation position. In accordance with this structure, since the installing work can be made easy, and the resin molded component performs a function of the groove wall, it is possible to achieve a space saving.

Effect of the Invention

The present invention achieves the following effects.

In the seal structure in accordance with the present invention having the structure mentioned above, since the gasket has the non-compression portion, in addition to the portion which is compressed between the case and the lid when the case and the lid are assembled, and the resin film is integrated with the non-compressed portion, there is constructed the seal structure in which the existence of the resin film does not affect the magnitude of the gasket reaction force at all. Accordingly, it is possible to enhance the shape retaining property of the gasket on the basis of the integration of the resin film and, in spite thereof, it is possible to provide the seal structure in which the gasket reaction force is not enhanced. Therefore, it is possible to prevent the casing from being broken on the basis of high reaction force of the gasket, and it is possible to make assembling of the casing easy (since it is not necessary to assemble the case and the lid against the high reaction force).

Further, it is possible to firmly couple the gasket and the resin film on the basis of the integration structure by the chemical means or the mechanical means, with regard to the integration of the gasket and the resin film. Further, seating of the gasket with respect to the installation position becomes better by the gasket and the resin film being manufactured in the same 3-D shape in the case that the installation position is formed in the 3-D shape, whereby the installation defect of the gasket is hardly caused. Further, in the case that the installation position at which the gasket is installed in the non-adhesion manner is formed in the groove shape having the side wall portions at both sides in the width direction, the height of the one side wall portion is set lower than that of the other side wall portion, the film is integrated with the gasket at the predetermined height position from the bottom surface portion of the gasket, and the film has such the structure that a part of the film is mounted on the one side wall portion when the gasket is installed to the groove, seating of the gasket with respect to the installation groove becomes better similarly, and the installation defect of the gasket is hardly caused.

Further, in the seal structure in accordance with the present invention having the structure mentioned above, since the gasket has the non-compressed portion, in addition to the portion which is compressed between the case and the lid when the case and the lid are assembled, and the resin molded component is integrated with the non-compressed portion, there is constructed the seal structure in which the existence of the resin molded component does not affect the magnitude of the gasket reaction force at all. Accordingly, it is possible to enhance the shape retaining property of the gasket on the basis of the integration of the resin molded component and, in spite thereof, it is possible to provide the seal structure in which the gasket reaction force is not enhanced. Therefore, it is possible to prevent the casing from being broken on the basis of high reaction force of the gasket, and it is possible to make assembling of the casing easy (since it is not necessary to assemble the case and the lid against the high reaction force).

Further, it is possible to easily and firmly couple the gasket and the resin molded component by executing the insert molding, with regard to the integration of the gasket and the resin molded component. Further, seating of the gasket with respect to the installation position becomes better by the gasket and the resin molded component being manufactured in the same 3-D shape in the case that the installation position is formed in the 3-D shape, whereby the installation defect of the gasket is hardly caused. Further, in the case that the installation position between the case and the lid at which the gasket is installed in the non-adhesion manner is formed in such the step shape that one side wall portion is omitted from the groove shape having the side wall portions at both sides in the width direction, and the resin molded component is arranged at the position corresponding to that of the omitted one side wall portion when the integrated component of the gasket and the resin molded component are installed at the installation position, the installing work is made easy, and the resin molded component perform a function of the groove wall. Therefore, it is possible to achieve space saving.

DETAILED DESCRIPTION OF PREFERRED EMBODIMENTS

Figure 1:
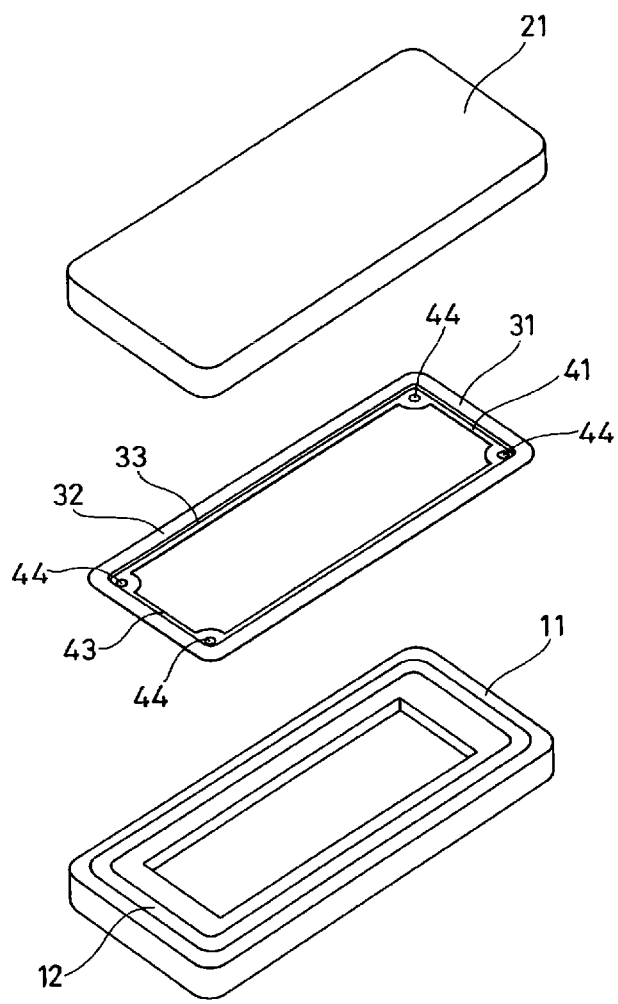
FIG. 1 is an exploded perspective view of a seal structure in accordance with a first embodiment of the present invention.

The following embodiments are included in the present invention.

(1) The present invention relates to a gasket structure for a waterproofed electronic equipment. As a gasket installed between a casing main body and a lid of the waterproofed electronic equipment, an O-ring or the like made of a rubber only has been conventionally used, however, it has trouble in a working property at a time of assembling, particularly due to a fine line shape formation of a gasket itself in accordance with a downsizing and a thinning of the equipment. In order to solve this problem, there can be thought of integrating a resin film with the rubber only gasket. However, since a rate of a thickness of the film, which is a rigid body, to a height of the rubber only portion is increased in a gasket cross section, in accordance with the fine line shape formation of the gasket as mentioned above, gasket reaction force is increased and there is fear of a breakage of the case. Accordingly, the following seal structures are employed.

(2) It is possible to hold down the increase of the reaction force by installing of the film in the non-compressed portion in an end portion of the gasket.

(3) Adhesion between the end portion of the gasket and the film is achieved by an adhesive agent previously applied to the film or by use of a self-adhesive rubber.

(4) As a structure without any adhesive agent, the film and the gasket are firmly coupled on the basis of an anchor effect by through holes being provided at a predetermined pitch in the film, or an end portion of the film being formed in a notch shape.

(5) In the case that the gasket installation portion of the casing is formed in a 3-D shape, the shape is copied to the film by a metal mold structure for formation of the gasket being made in a 3-D shape in conformity with the casing, so that an improvement of an assembling property can be achieved.

(6) In order to improve the assembling property, the seal is structured by integration of the film and the gasket. In order to solve high reaction force generation in the gasket, the seal portion is constructed as a gasket only structure, and the integration is made at the other positions than that of the seal portion. Further, in order to solve constraint of a rubber material and a film material, the film and the gasket are not adhered chemically, but adhered mechanically. Specifically, an adhesion strength is obtained by providing of the through holes in the film or tooling of the end surface of the film. In accordance with the structure mentioned above, a rigidity of a product itself is increased by formation of a film integrated gasket so that handling becomes very good, and an outer shape position is decided by the film so that a positional precision in a direction X-Y (a gasket plane direction) is easily obtained. The seal portion is constructed as the gasket only structure, and integration is made at the other position than that of the seal portion, thereby the high reaction force generation being solved. Further, since peeling occurs at the other position than that of the seal portion, even if the peeling is caused due to an adhesion defect, it does not affect a sealing performance.

(7) Further, the shape of the gasket is not limited to the planar shape, but applicable to a 3-D shape by the shape being copied to the film within the metal mold once before the integral molding.

(8) A material of the film is set, for example, to PI, PEN or PET, and a rubber material is set, for example, to a silicone rubber (a silicone rubber having a self-adhesiveness). A thickness of the film is set, for example, to 70 to 170 μm (in the case that a cross sectional size of the seal is about φ1 mm).

(9) The film and the gasket are integrated by the following mechanical means.

(9-1) Integral molding in the state of through holes being provided in the film.

(9-2) Integral molding in the state of the end surface of the film being tooled.

(9-3) Integral molding in the state of the end surface of the film being provided with notches and folded.

(9-4) Integral molding in the state of surface roughness of the film being made coarse.

(10) The installation groove has the side wall portions at both sides in the width direction, however, may be formed in a step shape having the side wall portion only at one side.

(11) A cross sectional shape of the gasket (the rubber portion) is no object.

(12) A gasket corresponding to a complicated shape of a cellular phone and having an improved assembling property is manufactured by a resin molded component (a molded component), which achieves a function of an inner wall of the groove as a part of the case, being manufactured in conformity with a shape of the cellular phone, and the gasket being integrally formed with the molded component.

(13) A gasket, which can be easily attached in conformity with an internal structure of a complicated cellular phone, can be manufactured by integrally forming with the resin molded component. Further, a positioning projection or hole or the like is provided in order to be precisely placed at a time of molding of the gasket and at a time of installing in the casing.

(14) The resin molded component is placed in the metal mold so as to be insert-molded. In the integrally molded gasket, deformation like as the gasket made only of rubber does not occur on the basis of the rigidity of the resin, and an assembling property is improved. Further, since the resin molded component performs a function of the groove wall, it is possible to achieve space saving.

(15) The molded component is manufactured with a resin such as a liquid crystal polymer or the like, which is suitable for thinly molding and has a good heat resistance.

(16) The gasket is formed by the resin molded component being set on a positioning pin of a metal mold. The rubber material is adhered to the resin molded component, and the gasket and the resin molded component are integrally formed. The gasket integrally formed with the resin molded component is easily installed and used in the casing.

(17) The gasket is integrally formed with the resin molded component having a sufficiently greater thickness than the film, the resin molded component is formed in conformity with the 3-D shape of the case, and the resin molded component performs a function of the groove wall inside the case.

EMBODIMENT

Next, a description will be given of embodiments in accordance with the present invention with reference to the accompanying drawings.

First Embodiment

Figure 2:
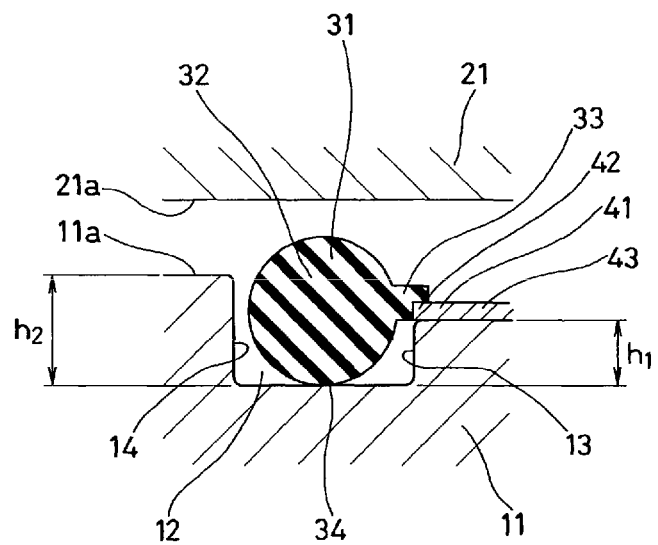
FIG. 2 is a cross sectional view of a substantial part of the seal structure.

FIG. 1 shows an exploded perspective view of a seal structure in accordance with a first embodiment of the present invention, and FIG. 2 is a cross sectional view of a substantial part thereof.

In both drawings, reference numerals 11 and 21 denote a case (a casing main body) and a lid which are fitted to each other so as to form a casing (an outer case) of a cellular phone terminal corresponding to one kind of an electronic equipment. A gasket 31 is installed in a non-adhesion manner between both the elements 11 and 21 so as to seal between the case 11 and the lid 21, and a resin film (a shape retaining film) 41 is integrated with the gasket 31 so as to enhance a shape retaining property of the gasket 31. Since an installation groove 12 for installing of the gasket 31 is formed in a peripheral edge portion (a side wall portion) of any one (the case 11 in the present embodiment) of the case 11 and the lid 21, the gasket 31 is installed to the installation groove 12 so as to be installed over a whole periphery of the casing, and when the case 11 and the lid 21 are assembled so as to come into contact with each other by mutually opposed surfaces 11a and 21a from an illustrated state, the gasket 31 is interposed in a state of being compressed between the case 11 and the lid 21.

The gasket 31 is formed to have a circular cross sectional shape by a predetermined rubber-like elastic material (for example, a silicone rubber). However, a portion having the circular cross sectional shape is a seal portion 32 which is compressed between the case 11 and the lid 21 at a time of assembling of the case 11 and the lid 21, a connection portion 33 which is not compressed between the case 11 and the lid 21 at a time of the case 11 and the lid 21 being assembled is integrally formed in a projection shaped element over a whole periphery of a side surface (an inner peripheral surface) of the seal portion 32, in the gasket 31 in addition to the seal portion 32, and a resin film 41 is integrated with respect to the connection portion 33. Accordingly, the resin film 41 is coupled only to the connection portion 33, and is not embedded within a thickness of the seal portion 32.

The resin film 41 is formed in a thin film shape as implied by the name by a predetermined resin material (for example, PI, PEN, PET), and is formed over a whole periphery of the side surface (the inner peripheral surface) of the gasket 31. Further, the resin film 41 is coupled to the connection portion 33 of the gasket 31 by a connection portion 42 which is a part (an outer peripheral portion) thereof, and a portion (an inner peripheral portion) other than the connection portion 42 is formed as an exposure portion 43 which is arranged in parallel to the gasket 31 after the installation. As shown in FIG. 1, the exposure portion 43 may be provided with a guide hole 44 for positioning or fixing of the gasket, or the like.

The gasket 31 and the resin film 41 are integrated by a chemical means, that is, are integrated by being adhered with an adhesive agent (not shown) which is previously applied to the resin film 41.

Further, as shown in FIG. 2, the seal structure in accordance with the embodiment is structured such that an installation position between the case 11 and the lid 21, where the gasket 31 is installed in a non-adhesion manner, is formed to be an installation groove 12 in a shape having side wall portions 13 and 14 at both sides in a width direction, a height dimension h1 of one side wall portion 13 positioned at inner side in the casing is set lower than a height dimension h2 of the other side wall portion 14 positioned at outer side in the casing (h1<h2), and the resin film 41 is integrated with the gasket 31 at a predetermined height position from a bottom surface portion 34 of the gasket 31, whereby the resin film 41 is mounted on the one side wall portion 13 by the partial exposure portion 43 which is a part thereof at a time of the gasket 31 being installed to the installation groove 12.

The seal structure having the construction mentioned above is to seal between the case 11 and the lid 21 to prevent a water droplet from entering into the inner portion of the casing, and is characterized in that the following operational effect can be achieved by the construction mentioned above.

In the seal structure having the structure mentioned above, since the gasket 31 has the non-compressed projection shaped connection portion 33, in addition to the seal portion 32 which is compressed between the case 11 and the lid 21 at a time of the case 11 and the lid 21 being assembled, and the resin film 41 is integrated with respect to the non-compressed connection portion 33, there is provided the seal structure in which existence of the resin film 41 does not affect a magnitude of the gasket reaction force at all. Accordingly, it is possible to provide the seal structure in which a shape retaining property of the gasket 31 is enhanced on the basis of the integration of the resin film 41, but reaction force of the gasket 31 is not enhanced in spite thereof. Therefore, it is possible to prevent the casing from being broken due to the high reaction force of the gasket 31, and it is possible to make assembling of the casing easy.

Further, with regard to the integration of the gasket 31 and the resin film 41, since the gasket 31 and the resin film 41 are integrated by the chemical means, that is, are integrated by being adhered with an adhesive agent (not shown) which is previously applied to the resin film 41, the gasket 31 and the resin film 41 are firmly coupled. In addition, in the case that a material of the gasket 31 is a self-adhesive rubber, it is possible to adhere them on the basis of the self-adhesiveness without applying any adhesive agent.

Further, since the installation position between the case 11 and the lid 21, at which the gasket 31 is installed in the non-adhesion manner, is formed to be the installation groove 12 in the shape having the side wall portions 13 and 14 at both sides in the width direction, the height dimension h1 of the one side wall portion 13 is set lower than the height dimension h2 of the other side wall portion 14, the resin film 41 is integrated with the gasket 31 at the predetermined height position from the bottom surface portion 34 of the gasket 31, and the resin film 41 is mounted on the one side wall portion 13 by the partial exposure portion 43 which is a part thereof at a time of the gasket 31 being installed to the installation groove 12, seating of the gasket 31 with respect to the installation groove 12 becomes good, and an installation defect of the gasket 31 is hardly caused.

As for the seal structure in accordance with the first embodiment, there can be a thought of adding or changing the structure as described below.

Second Embodiment

Figure 3:
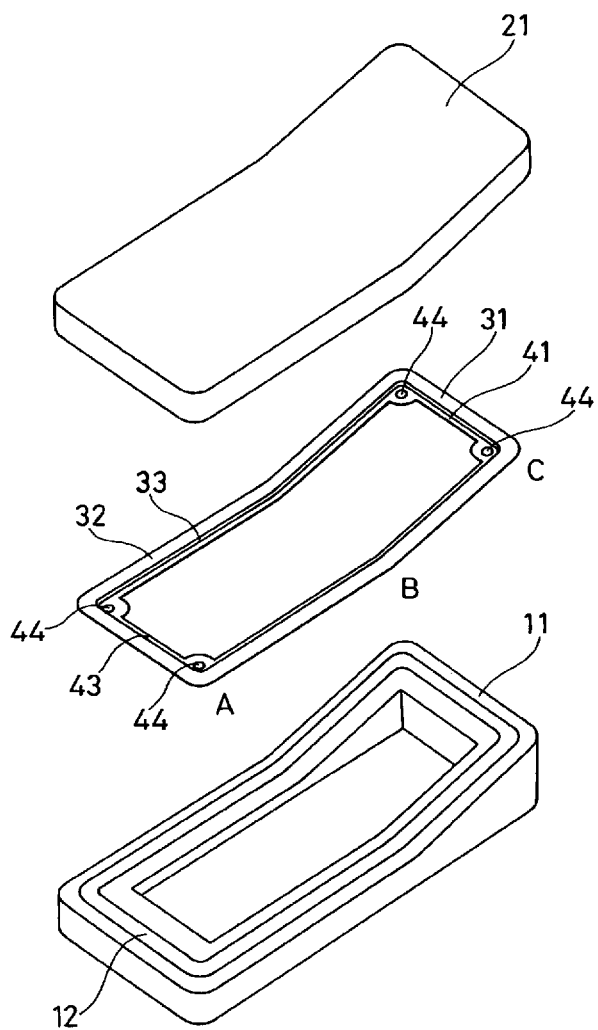
FIG. 3 is an exploded perspective view of a seal structure in accordance with a second embodiment of the present invention.

In the first embodiment, the installation groove 12, the gasket 31 and the resin film 41 are all formed in a planar shape. In place thereof, the installation groove 12 is formed in a 3-D shape which has a predetermined planar shape and whose height position changes in an overlapping direction of the case 11 and the lid 21, as exemplified in FIG. 3. In this case, the gasket 31 and the resin film 41 are manufactured in the same 3-D shape, by changing of a cavity shape of a gasket forming metal mold or otherwise. In accordance with this structure, since the gasket 31 is not deformed by force after the installation, the installation defect of the gasket 31 is hardly caused, and it is possible to enhance a sealing performance and a parts durability. In the figure, the 3-D shape is formed in such a shape that is planar from a portion A to a portion B, and becomes higher in its height position little by little from the portion B to a portion C. However, it is not limited to this.

Third Embodiment

With regard to the integration of the gasket 31 and the resin film 41, both the elements 31 and 41 are integrated by the chemical means in the first embodiment. However, in place thereof, both the elements 31 and 41 are integrated by a mechanical means.

Figure 4:
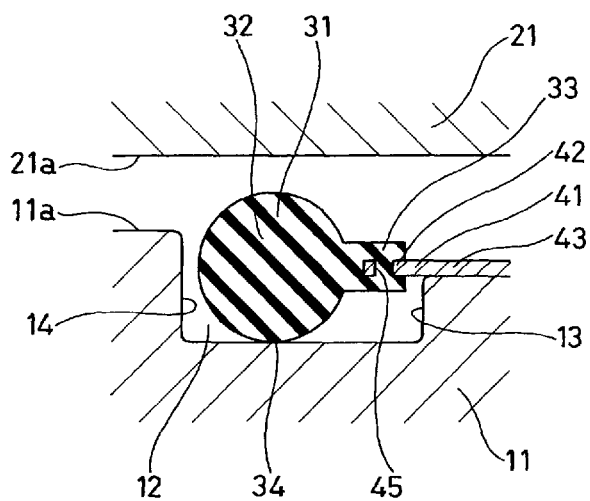
FIG. 4 is a cross sectional view of a substantial part of a seal structure in accordance with a third embodiment of the present invention.

Specifically, as shown in FIG. 4, a lot of through holes 45 are provided at a predetermined pitch in the resin film 41, both the elements 31 and 41 are integrally formed by a metal mold, a part of the elastic material is filled in the through holes 45, thereby both the elements 31 and 41 being engaged.

Fourth Embodiment

Figure 5A:
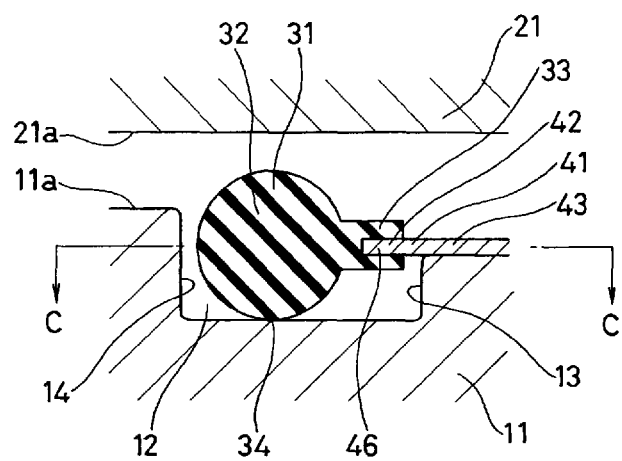
FIG. 5A is a cross sectional view of a substantial part of a seal structure in accordance with a fourth embodiment of the present invention.
Figure 5B:
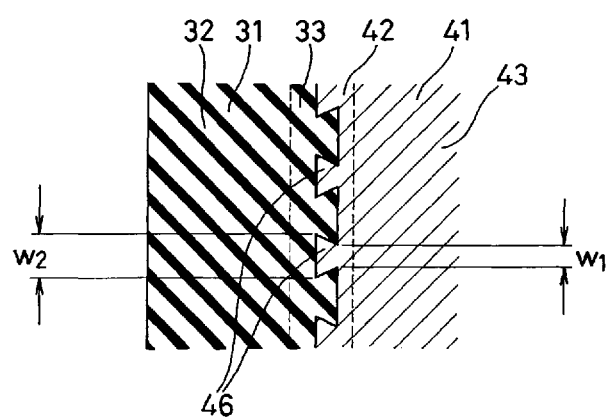
FIG. 5B is a sectional view along a line C-C in FIG. 5A.

Otherwise, as shown in FIGS. 5(A) and 5(B), come-off preventing anchor shaped parts are provided in an end portion of the resin film 41, both the elements 31 and 41 are integrally formed by a metal mold, and the anchor shaped parts and the elastic material are engaged. As the anchor shaped parts, a lot of protruding pieces 46 being widened toward the end are provided at a predetermined pitch, the protruding pieces 46 having a width w2 of an tip end portion which is wider than a width w1 of a base end portion, and are embedded in the elastic material.

Fifth Embodiment

Figure 6A:
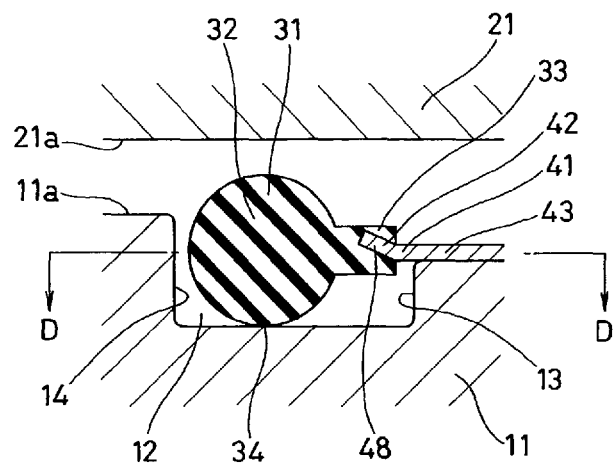
FIG. 6A is a cross sectional view of a substantial part of a seal structure in accordance with a fifth embodiment of the present invention.
Figure 6B:
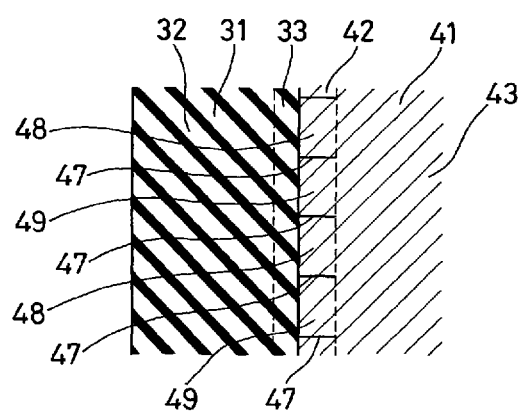
FIG. 6B is a sectional view along a line D-D in FIG. 6A.

Otherwise, as shown in FIGS. 6(A) and 6(B), come-off preventing anchor shaped parts are provided in an end portion of the resin film 41, both the elements 31 and 41 are integrally formed by a metal mold, and the anchor shaped parts and the elastic material are engaged. As the anchor shaped parts, a lot of notches 47 are provided at a predetermined pitch, pieces between the notches 47 are alternately mountain folded and valley folded (mountain fold pieces 48 and valley fold pieces 49 are provided alternately), and they are embedded in the elastic material.

Sixth Embodiment

As the anchor shaped parts, a surface roughness or the like provided by roughening of a surface of the film 41 may be used besides the above.

Seventh Embodiment

Figure 7:
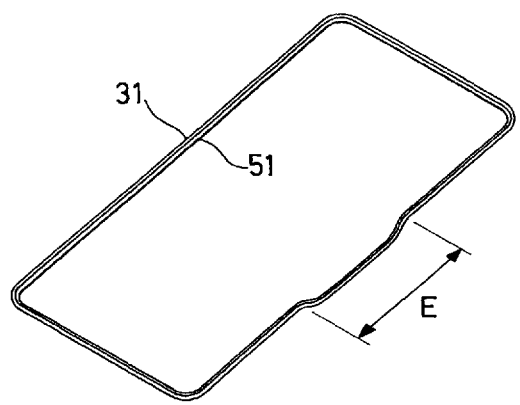
FIG. 7 is a perspective view of an integrated component of a gasket and a resin molded component which is used in a seal structure in accordance with a seventh embodiment of the present invention.
Figure 8A:
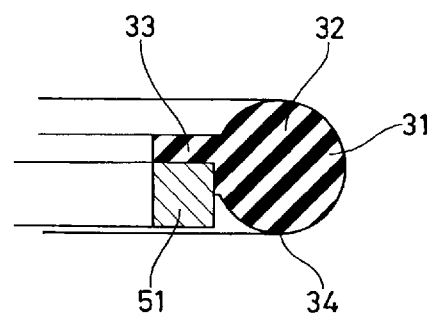
FIG. 8A is a cross sectional view of a substantial part of the integrated component.
Figures 8B, 8C:
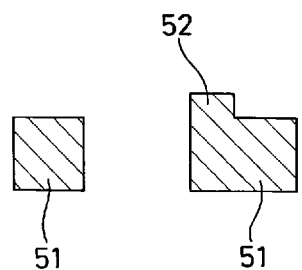
FIG. 8B is a cross sectional view of a substantial part of the resin molded component.
FIG. 8C is a cross sectional view of a substantial part showing a shape of an engagement portion provided in the resin molded component.
Figure 9:
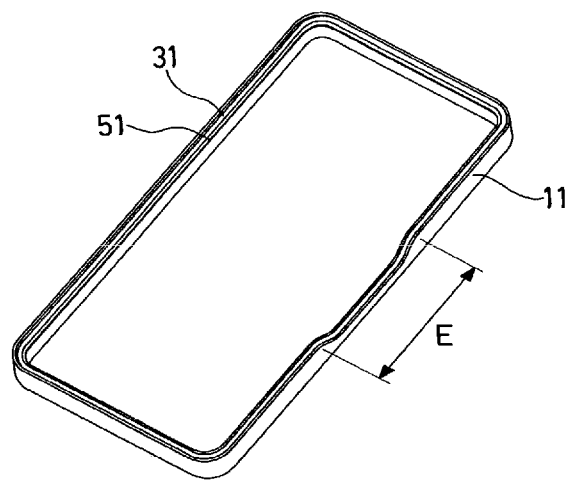
FIG. 9 is a perspective view showing a state in which the integrated component is fitted to a case.
Figure 10:
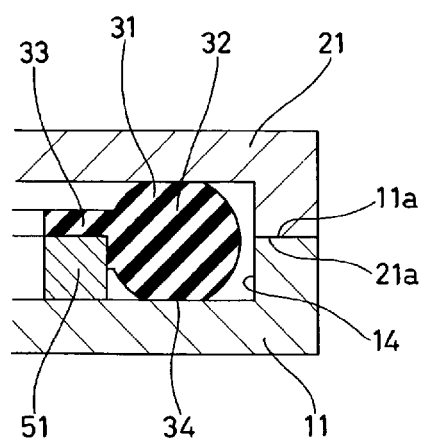
FIG. 10 is a cross sectional view of a substantial part of the seal structure.
Figure 11:
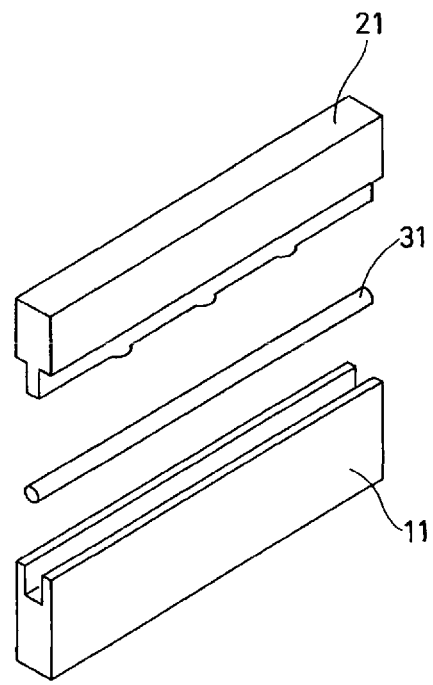
FIG. 11 is an explanatory view of a seal structure in accordance with a conventional art.
Figure 12:
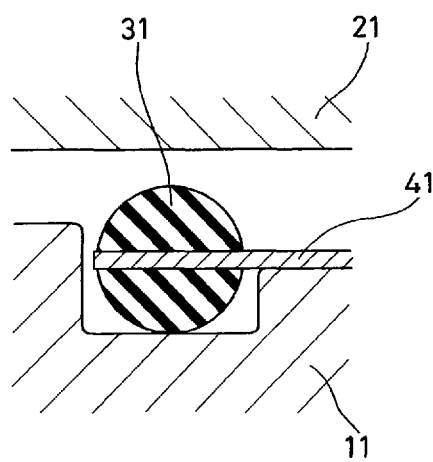
FIG. 12 is a cross sectional view of a substantial part of a seal structure in accordance with a comparative example.

FIG. 7 shows a perspective view of an integrated component of a gasket and a resin molded component which is used in a seal structure in accordance with a seventh embodiment of the present invention, and FIGS. 8(A), 8(B) and 8(C) show a cross section of a substantial part thereof. Further, FIG. 9 shows a perspective view of a state in which the integrated component is fitted to a case, and FIG. 10 shows a cross section of a substantial part of the whole of the seal structure.

In the seventh embodiment, a resin molded component 51 is used in place of the resin film 41 in the first to sixth embodiments. In particular, the resin molded component 51 is integrated with the gasket 31 in order to enhancing the shape retaining property of the gasket 31.

The gasket 31 is formed to have a circular cross sectional shape by a predetermined rubber-like elastic material (for example, a silicone rubber) in the same manner as each of the embodiments, however, the portion having the circular cross sectional shape is a seal portion 32 which is compressed between the case 11 and the lid 21 at a time of the case 11 and the lid 21 being assembled, a connection portion 33, which is not compressed between the case 11 and the lid 21 at a time of the case 11 and the lid 21 being assembled, is integrally formed as a projection shaped element over a whole periphery on a side surface (an inner peripheral surface) of the seal portion 32 of the gasket 31 in addition to the seal portion 32, and the resin molded component 51 is integrated with respect to the connection portion 33. Therefore, the resin molded component 51 is coupled only to the connection portion 33, and is not embedded within a thickness of the seal portion 32.

The resin molded component 51 is formed as a three-dimensionally shaped part (a part having a rectangular cross sectional shape in the figures) having a predetermined height dimension by a predetermined resin material (for example, a liquid crystal polymer which can be formed thin and has a good heat resistance), and an upper surface thereof is adhered by vulcanization to a lower surface of the connection portion 33. The resin molded component 51 is provided over a whole periphery on a side surface (an inner peripheral surface) of the gasket 31. Further, the resin molded component 51 integrally has projection shaped engagement portions 52 for positioning or fixing of the gasket from place to place on the periphery (for example, six positions on the periphery).

The gasket 31 and the resin molded component 51 are integrated in accordance with insert molding, that is, are integrated in accordance with insert molding in which the gasket 31 is molded by a metal mold in a state of the resin molded component 51, which is previously manufactured in a product shape, being inserted into a cavity space of the gasket forming metal mold.

As shown in FIG. 9, an installation position between the case 11 and the lid (not shown) to which the gasket 31 is installed in a non-adhesion manner is formed in a 3-D shape which has a predetermined planar shape and whose height position changes in an overlapping direction of the case 11 and the lid, and the integrated component of the gasket 31 and the resin molded component 51 is manufactured in the same 3-D shape in conformity thereto. An illustrated 3-D shape is formed such that a part of the periphery denoted by reference symbol E is lower than the other portions.

Further, as shown in FIG. 10, the installation position between the case 11 and the lid 21 to which the gasket 31 is installed in a non-adhesion manner is formed in such a shape that the side wall portion 13 at one side is omitted from the groove shape (refer to FIG. 2) having the side wall portions 13 and 14 at both sides in the width direction (a step shape having only the side wall portion 14 at the remaining side), and is structured such that the resin molded component 51 is arranged at a position corresponding to the omitted side wall portion 13 when the integrated component of the gasket 31 and the resin molded component 51 is installed to the installation position.

The seal structure having the construction mentioned above is to seal between the case 11 and the lid 21 to prevent the water droplet from entering into the inner portion of the casing, and is characterized in that the following operational effects can be achieved by the construction mentioned above.

In the seal structure having the construction mentioned above, since the gasket 31 has the projection shaped non-compressed connection portion 33 in addition to the seal portion 32 which is compressed between the case 11 and the lid 21 at a time of the case 11 and the lid 21 being assembled, and the resin molded component 51 is integrated with respect to the non-compressed connection portion 33, there is provided the seal structure in which the existence of the resin molded component 51 does not affect a magnitude of the gasket reaction force at all. Accordingly, it is possible to provide the seal structure in which the shape retaining property of the gasket 31 is enhanced by the integration of the resin molded component 51, but the gasket reaction force is not enhanced in spite thereof. Therefore, it is possible to prevent the casing from being broken by the high reaction force generation of the gasket 31, and it is possible to make assembling of the casing easy.

Further, with regard to the integration of the gasket 31 and the resin molded component 51, since the gasket 31 and the resin molded component 51 are integrated in accordance with insert molding, it is possible to easily and firmly couple the resin molded component 51 to the gasket 31.

Further, since the gasket 31 and the resin molded component 51 are manufactured in the same 3-D shape in the case that the installation position is formed in the 3-D shape, seating of the gasket 31 becomes better with respect to the installation position, and the installation defect of the gasket 31 is hardly caused.

Further, since the installation position between the case 11 and the lid 21 to which the gasket 31 is installed in a non-adhesion manner is formed in such the shape that the side wall portion 13 at one side is omitted from the groove shape (refer to FIG. 2) having the side wall portions 13 and 14 at both sides in the width direction (the stepped shape having only the side wall portion 14 at the remaining side), and is structured such that the resin molded component 51 is arranged at the position corresponding to the omitted side wall portion 13 at a time of the integrated component of the gasket 31 and the resin molded component 51 being installed to the installation position, the installing work is made easy, and the resin molded component 51 performs a function of the groove wall. Accordingly, space saving can be achieved.

What is claimed is:

1. A seal structure for sealing between a case and a lid which are combined with each other so as to form a casing of an electronic equipment, the seal structure for the electronic equipment comprising:
   a gasket non-adhesively sandwiched between said case and lid, the gasket including:
   a seal portion; and
   a connection portion extending from an inner peripheral surface of said seal portion so as to form a monolithic projection along an entire periphery of said seal portion; and
   a resin film coupled only to said connection portion of said gasket,
   wherein, at a time of sealing between said case and lid, said gasket includes:
   the connection portion which is not compressed between said case and lid when said gasket is in use after said case and lid are in a final assembled state, and
   the seal portion which is compressed between said case and lid when said gasket is in use after said case and lid are in a final assembled state, and
   wherein said resin film is circumferentially spaced apart from said seal portion so as to not be embedded within said seal portion such that an interior of said seal portion is completely devoid of said resin film.

2. The seal structure for the electronic equipment as claimed in claim 1, wherein the gasket and the resin film are chemically integrated with each other by one of:
   an adhesive agent, or
   a self-adhesive rubber which is used as a material of the gasket.

3. The seal structure for the electronic equipment as claimed in claim 2, wherein an installation position between the case and the lid at which the gasket is installed has a 3-D shape with a planar section and an inclined section, and the gasket and the resin film have a shape corresponding to the 3-D shape of the installation position.

4. The seal structure for the electronic equipment as claimed in claim 3, wherein the installation position between the case and the lid at which the gasket is installed has a groove shape, a height of a first side wall of the groove is lower than that of a second side wall of the groove, the resin film is integrated with said gasket at a predetermined height from a bottom surface of the gasket, and a part of said resin film is mounted on said first side wall when said gasket is installed to said groove.

5. The seal structure for the electronic equipment as claimed in claim 2, wherein the installation position between the case and the lid at which the gasket is installed has a groove shape, a height of a first side wall of the groove is lower than that of a second side wall of the groove, the resin film is integrated with said gasket at a predetermined height from a bottom surface of the gasket, and a part of said resin film is mounted on said first side wall when said gasket is installed to said groove.

6. The seal structure for the electronic equipment as claimed in claim 2, wherein the installation position between the case and the lid at which the gasket is installed has a groove shape, a height of a first side wall of the groove is lower than that of a second side wall of the groove, the resin film is integrated with said gasket at a predetermined height from a bottom surface of the gasket, and a part of said resin film is mounted on said first side wall when said gasket is installed to said groove.

7. The seal structure for the electronic equipment as claimed in claim 1, wherein the gasket and the resin film are mechanically integrated with each other by one of:
   integral molding via through holes provided at a predetermined pitch in the resin film, or
   integral molding via come-off preventing anchor shaped parts provided at an end portion of the resin film.

8. The seal structure for the electronic equipment as claimed in claim 7, wherein an installation position between the case and the lid at which the gasket is installed has a 3-D shape with a planar section and an inclined section, and the gasket and the resin film have a shape corresponding to the 3-D shape of the installation position.

9. The seal structure for the electronic equipment as claimed in claim 8, wherein the installation position between the case and the lid at which the gasket is installed has a groove shape, a height of a first side wall of the groove is lower than that of a second side wall of the groove, the resin film is integrated with said gasket at a predetermined height from a bottom surface of the gasket, and a part of said resin film is mounted on said first side wall when said gasket is installed to said groove.

10. The seal structure for the electronic equipment as claimed in claim 7, wherein the installation position between the case and the lid at which the gasket is installed has a groove shape, a height of a first side wall of the groove is lower than that of a second side wall of the groove, the resin film is integrated with said gasket at a predetermined height from a bottom surface of the gasket, and a part of said resin film is mounted on said first side wall when said gasket is installed to said groove.

11. The seal structure for the electronic equipment as claimed in claim 1, wherein an installation position between the case and the lid at which the gasket is installed has a 3-D shape with a planar section and an inclined section, and the gasket and the resin film have a shape corresponding to the 3-D shape of the installation position.

12. The seal structure for the electronic equipment as claimed in claim 11, wherein the installation position between the case and the lid at which the gasket is installed has a groove shape, a height of a first side wall of the groove is lower than that of a second side wall of the groove, the resin film is integrated with said gasket at a predetermined height from a bottom surface of the gasket, and a part of said resin film is mounted on said first side wall when said gasket is installed to said groove.

13. The seal structure for the electronic equipment as claimed in claim 1, wherein the installation position between the case and the lid at which the gasket is installed has a groove shape, a height of a first side wall of the groove is lower than that of a second side wall of the groove, the resin film is integrated with said gasket at a predetermined height from a bottom surface of the gasket, and a part of said resin film is mounted on said first side wall when said gasket is installed to said groove.

14. A seal structure for sealing between a case and a lid which are combined with each other so as to form a casing of an electronic equipment, the seal structure for the electronic equipment comprising:
   a gasket non-adhesively sandwiched between said case and lid, the gasket including:
   a seal portion; and
   a connection portion extending from an inner peripheral surface of said seal portion so as to form a monolithic projection along an entire periphery of said seal portion; and
   a resin molded component coupled only to said connection portion of said gasket,
   wherein, at a time of sealing between said case and lid, said gasket includes:
      the connection portion which is not compressed between said case and lid when said gasket is in use after said case and lid are in a final assembled state, and
      the seal portion which is compressed between said case and the lid when said gasket is in use after said case and the lid are in a final assembled state, and
   wherein said resin molded component is circumferentially spaced apart from said seal portion and not embedded in said seal portion such that an interior of said seal portion is completely devoid of said resin film.

15. The seal structure for the electronic equipment as claimed in claim 14, wherein the resin molded component is inserted within the non-compressed portion of the gasket.

16. The seal structure for the electronic equipment as claimed in claim 15, wherein an installation position between the case and the lid at which the gasket is installed has a 3-D shape with a planar section and an inclined section, and the gasket and the resin molded component have a shape corresponding to the 3-D shape of the installation position.

17. The seal structure for the electronic equipment as claimed in claim 16, wherein the installation position between the case and the lid at which the gasket is installed has a step shape with one side wall omitted from a groove, and said resin molded component is arranged at a position corresponding to said omitted side wall portion.

18. The seal structure for the electronic equipment as claimed in claim 15, wherein the installation position between the case and the lid at which the gasket is installed has a step shape with one side wall omitted from a groove, and said resin molded component is arranged at a position corresponding to said omitted side wall portion.

19. The seal structure for the electronic equipment as claimed in claim 14, wherein an installation position between the case and the lid at which the gasket is installed has a 3-D shape with a planar section and an inclined section, and the gasket and the resin molded component have a shape corresponding to the 3-D shape of the installation position.

20. The seal structure for the electronic equipment as claimed in claim 19, wherein the installation position between the case and the lid at which the gasket is installed has a step shape with one side wall omitted from a groove, and said resin molded component is arranged at a position corresponding to said omitted side wall portion.

21. The seal structure for the electronic equipment as claimed in claim 14, wherein the installation position between the case and the lid at which the gasket is installed has a step shape with one side wall omitted from a groove, and said resin molded component is arranged at a position corresponding to said omitted side wall portion.

22. A seal structure for sealing between a case and a lid, the seal structure comprising:
   a gasket non-adhesively sandwiched between said case and lid, said gasket including:
   a seal body; and
   a connection lip extending from an inner peripheral surface of said seal body so as to form a monolithic projection along an entire periphery of said seal body; and
   a resin film coupled only to said connection lip of said gasket,
   wherein, at a time of sealing between said case and lid:
      the connection lip is not compressed between said case and lid when said gasket is in use after said case and lid are in a final assembled state, and
      the seal body is compressed between said case and lid when said gasket is in use after said case and lid are in a final assembled state, and
   wherein an interior of seal body is completely devoid of said resin film.

23. The seal structure as claimed in claim 22, wherein the resin film is inserted within the connection lip of the gasket.

24. The seal structure as claimed in claim 22, wherein an installation position between the case and the lid at which the gasket is installed has a 3-D shape with a planar section and an inclined section, and the gasket and the resin film have a shape corresponding to the 3-D shape of the installation position.

25. The seal structure as claimed in claim 22, wherein the installation position between the case and the lid at which the gasket is installed has a step shape with one side wall omitted from a groove, and said resin film is arranged at a position corresponding to said omitted side wall portion.

* * * * *